US008754645B2

(12) United States Patent
Gross et al.

(10) Patent No.: US 8,754,645 B2
(45) Date of Patent: Jun. 17, 2014

(54) METHOD FOR SPATIALLY RESOLVED DETERMINATION OF AN MR PARAMETER

(75) Inventors: Patrick Gross, Langensendelbach (DE); Antje Kickhefel, Erlangen (DE); Joerg Roland, Hemhofen (DE)

(73) Assignee: Siemens Aktiengesellschaft, Munich (DE)

( * ) Notice: Subject to any disclaimer, the term of this patent is extended or adjusted under 35 U.S.C. 154(b) by 445 days.

(21) Appl. No.: 13/239,643

(22) Filed: Sep. 22, 2011

(65) Prior Publication Data

US 2012/0068703 A1 Mar. 22, 2012

(30) Foreign Application Priority Data

Sep. 22, 2010 (DE) .......................... 10 2010 041 212

(51) Int. Cl.
*G01V 3/00* (2006.01)
(52) U.S. Cl.
USPC .......................................... 324/309; 324/307
(58) Field of Classification Search
USPC ........................... 324/300–322; 600/409–445
See application file for complete search history.

(56) References Cited

U.S. PATENT DOCUMENTS

| 5,204,625 A * | 4/1993 | Cline et al. ..................... 324/306 |
| 5,384,573 A * | 1/1995 | Turpin ............................ 342/179 |
| 5,736,958 A * | 4/1998 | Turpin ............................ 342/179 |
| 6,160,398 A | 12/2000 | Walsh |
| 7,057,387 B2 | 6/2006 | Duensing et al. |
| 7,227,359 B2 | 6/2007 | Ma |
| 7,466,128 B2 | 12/2008 | Walsh |
| 8,211,019 B2 * | 7/2012 | Sumi .............................. 600/442 |
| 8,280,136 B2 * | 10/2012 | Gotardo et al. ................ 382/131 |
| 2012/0224757 A1 * | 9/2012 | Gross .............................. 382/131 |
| 2012/0278005 A1 * | 11/2012 | Sumi ............................... 702/43 |
| 2013/0144165 A1 * | 6/2013 | Ebbini et al. .................. 600/439 |
| 2013/0307536 A1 * | 11/2013 | Feng et al. ..................... 324/309 |

OTHER PUBLICATIONS

"Real-Time Quantification of $T^*_2$ Changes Using Multiecho Planar Imaging and Numerical Methods," Hagberg et al., Magnetic Resonance in Medicine, vol. 48 (2002) pp. 877-882.
"Information Theory, Inference, and Learning Algorithms," MacKay (2003) pp. 341-342.
"k-TE Generalized Autocalibrating Partially Parallel Acquisition (GRAPPA) for Accelerated Multiple Gradient-Recalled Echo (MGRE) $R_2^*$ Mapping in the Abdomen," Yin et al., Magnetic Resonance in Medicine, vol. 60 (2009) pp. 507-516.

* cited by examiner

*Primary Examiner* — Brij Shrivastav
(74) *Attorney, Agent, or Firm* — Schiff Hardin LLP

(57) ABSTRACT

In a magnetic resonance (MR) method and apparatus for spatially resolved determination of at least one MR parameter that influences an MR signal detected in an MR measurement of a region of an examination subject, first complex image data and second complex image data, respectively acquired with different acquisition coils and at different echo times in an echo imaging sequence, are provided to a processor. The different image data sets have complex image points that correspond with each other with regard to the imaged volume element of the examination subject. The MR parameter is determined in the processor for at least a portion of these image points by determination of an image point vector respectively for the first and second echo times and by combining the image point vectors to at least partially compensate echo time-independent phase or magnitude portions in the acquired image data.

25 Claims, 7 Drawing Sheets

METHOD FOR SPATIALLY RESOLVED DETERMINATION OF AN MR PARAMETER

BACKGROUND OF THE INVENTION

1. Field of the Invention

The present invention concerns a method for spatially resolved determination of a magnetic resonance (MR) parameter, in particular an MR parameter that influences an MR signal detected given an MR measurement of a region of an examination subject. Furthermore, the invention concerns a magnetic resonance system for implementation of such a method.

2. Description of the Prior Art

Magnetic resonance tomography (MRT) is an imaging modality that enables the acquisition of two-dimensional or three-dimensional image data sets that can depict structures inside an examination subject (in particular even soft tissue) at high resolution. In MRT, protons in the examination subject are aligned in a basic magnetic field ($B_0$) so that a macroscopic magnetization appears that is subsequently excited via the radiation of RF (radio-frequency) pulses. The decay of the excited magnetization is subsequently detected by means of one or more induction coils, wherein a spatial coding of the acquired signal is achieved via the switching of slice selection, phase coding and frequency coding gradients before or, respectively, during the acquisition. The acquisition of the decay signals thereby regularly takes place with a quadrature detection so that both the phase and the amplitude of the signal are detected. The signals detected in positional frequency space (frequency domain) (k-space) can accordingly be represented as complex numbers and be transformed by means of a Fourier transformation into image space (image domain), in which phases and magnitudes can now be determined with spatial resolution.

In many imaging methods only the magnitude of the complex image data is used to create an intensity image. The phase information is discarded. Furthermore, a combination of the magnitude data that were acquired with different coils is not optimal with regard to the signal-to-noise ratio (SNR).

For example, in conventional $T2^*$ (observed spin-spin relaxation time) or $R2^*$ ($01/T2^*$) imaging the magnitudes of three or more images are considered that were acquired at different echo times (TEs) from an individual proton species (for example via the use of a fat suppression). The $T2^*$ time can subsequently be determined with spatial resolution via the adaptation of a decay function to the magnitudes in the image data. However, this approach is very time-consuming and correspondingly prone to movement artifacts.

Other imaging methods use the acquired phase information. For example, the differences of the magnetic susceptibility of different tissue lead to phase differences. In susceptibility-weighted imaging (SWI), an expanded contrast signal image is generated from the acquired magnitude and phase information. This expanded contrast signal image has a contrast that is dependent on the oxygen content of the blood. Additional examples generally include phase contrast imaging as well as proton resonance frequency (PRF) shift thermometry. In this type of imaging, a shift of the phase in acquired phase images is detected that is caused by a shift of the proton resonance frequency due to a temperature change. In general a shift of the phase is based on a shift of the resonance frequency of the excited protons.

In addition to these phase shifts with information content, there is a series of effects that cause unwanted phase shifts and can conceal usable information. Among these effects are an inhomogeneity of the static $B_0$ field, the susceptibility of articles and materials within or in proximity to the patient, phase shifts of the radiated RF pulses and errors in the chronology of the acquisition sequence. Phase shifts that can develop differently for different acquisition or reception coils also can occur in the acquisition chain or in the acquisition channel of the respective coil.

These phase shifts make it difficult to compare and combine image data acquired at different echo times with one another. In particular, the combination of MR data acquired with different acquisition or reception coils while acquiring phase information has proven to be difficult, since each acquisition channel has a different phase shift. Objects within the examination subject—for example air bubbles, implants, needles or the like—can also lead to susceptibility artifacts, and thus also to phase shifts.

It is desirable to combine MR parameters, for example the $T2^*$ relaxation time or the resonance frequency shift $\omega$, as precisely and effectively as possible. Magnetic resonance (MR) data acquired for different echo times or with different reception coils should be optimally combined with one another in the determination so that the signal-to-noise ratio is improved and usable phase information is retained. In order to enable shorter scan durations, the method should also be capable of enabling such a combination for accelerated acquisition methods and multi-echo imaging sequences. Moreover, the data should be combined in a well-defined manner in order to be able to make reasonable statements about the data acquired in such a manner, for example about errors or noises.

A method known from the prior art for $R2^*$ imaging is k-TE GRAPPA, which is described in detail in "k-TE Generalized Autocalibrating Partially Parallel Acquisition [sic] (GRAPPA) für Accelerated Multiple Gradient-Recalled Echo (MGRE)R2* Mapping in the Abdomen", by Xiaoming Yin et al., Magnetic Resonance in Medicine 61:507-516 (2009). The method uses a partially parallel imaging method (GRAPPA) in combination with a view-sharing method in which missing k-space lines in incompletely scanned k-space are reconstructed on the basis of k-space lines acquired with adjacent coils and temporarily adjacent sequences. The result of the method is a series of images of different echo times (TE), wherein the image noise in the image data varies spatially due to the reconstruction process. How the acquired image data can be combined optimally with regard to SNR is not disclosed in this publication.

Given a combination of image data that takes phase into account, in conventional methods the phases of adjacent image points are compared in order to produce a total phase estimation. Image points with large phase variation, for example in regions with low SNR or along tissue boundaries, can interfere with the phase correction method. Furthermore, methods are known from U.S. Pat. No. 7,227,359 B2 (for example) that are based on phase gradients in the image data and that implement a region expansion (region growing) to determine the phases using a seed image point.

For image data that were acquired with a multi-echo imaging sequence, for example with a single-shot or segmented EPI (echoplanar imaging) sequence, a "characteristic" echo time (TE) is normally associated with the data. This characteristic TE is typically the TE with which central k-space lines were scanned. However, in such sequences different spatial frequencies (k-space lines) are scanned using different TEs, such that these respectively contribute to an error in the reconstructed image data depending on the respective TE. The errors in the phase accordingly depend on the acquisition sequence and moreover have a spatial dependency, such that they can only be predicted with difficulty.

SUMMARY OF THE INVENTION

An object of the present invention is to reduce at least a few of the aforementioned disadvantages and to provide an improved method to determine an MR parameter. In particular, a simple and precise determination should be enabled based on multiple image data sets also acquired with different acquisition coils.

According to a first aspect of the present invention, a method is provided for spatially resolved determination of at least one MR parameter that influences an MR signal detected given an MR measurement of a region of an examination subject. The method includes providing first complex image data to a processor that were acquired with an echo imaging sequence during a first echo time, wherein the first image data include at least one first image data set that was acquired with a first acquisition coil and a second image data set that was acquired with a second acquisition coil, and providing second complex image data to the processor that were acquired with an echo imaging sequence during a second echo time, wherein the second image data include at least one first image data set that was acquired with a first acquisition coil and a second image data set that was acquired with the second acquisition coil. The different image data sets have complex image points that correspond with regard to the imaged volume element of the examination subject. For example, for a portion of or all image points there is for each image point in the first image data set a corresponding image point in the second image data set, wherein both depict the same volume element of the examination subject but were acquired with different coils.

In the processor, the MR parameter is determined for at least one portion of these image points by determination, for each of the image points, of a first image point vector for the first echo time of the first image data from the first image data and determination of a second image point vector for the second echo time from the second image data, wherein an image point vector represents the corresponding image points of the at least two image data sets of the respective image data. Furthermore, the determination of the at least one MR parameter for each of the image points takes place on the basis of the image point vector for the first echo time and the image point vector for the second echo time for the respective image point, wherein the determination of such a combination of the vectors comprises that echo time-independent phase or magnitude portions are at least partially compensated in the acquired image data.

Naturally it is likewise possible to compensate for echo time-independent phase and magnitude proportions, i.e. to at least partially remove them. By the pixel-by-pixel determination of the MR parameter, a spatially resolved parameter map can be obtained. Since image data sets that were acquired with the same acquisition coil at different echo times (TE) are used in the determination, the TE-independent phase or, respectively, magnitude portions (that, for example, are caused by the respective reception channel) can be removed in a simple manner. A suitable combination of the acquired image data sets can be achieved by the use of the vectors for different TEs (that respectively represent image points acquired with different coils) to determine the parameter for an image point, which leads to an improvement of the precision in the parameter determination.

In an embodiment, the determination of the at least one MR parameter takes place using an analytical calculation. The MR parameter can be determined by means of an explicit analytical function that, for example, is dependent on the difference between the first and second echo time and the first and second image point vector for the respective image point. A simple and reproducible determination of the MR parameter is therefore possible using the multiple image data sets.

The at least one MR parameter advantageously comprises a resonance frequency shift ($\omega$) and/or a T2* relaxation time. It is precisely for these parameters that the removal of the TE-independent phase or magnitude portions leads to an increase of the precision in the determination.

The determination of the resonance frequency shift $\omega$ for an image point can, for example, comprise the determination of a scalar product of the complexly conjugated second image point vector and of the first image point vector of the corresponding image point. The second image point vector can be transposed before the determination of the scalar product. Since the image points in the vectors are complex, a combination of the different image data sets can thus take place while maintaining the TE-dependent phase portions.

The determination of the resonance frequency shift for an image point can furthermore comprise the determination of a scalar product of the first complexly conjugated (and transposed) image point vector and the second image point vector and a division of the two scalar products. For example, the determination of the resonance frequency shift $\omega$ for an image point takes place according to $$\omega = \frac{1}{-2i(\tau_2 - \tau_1)} \ln\left[\frac{\vec{d}_2^+ \vec{d}_1}{\vec{d}_1^+ \vec{d}_2}\right], \quad (1)$$

wherein $d_1$ and $d_2$ designate the image point vectors for the first and second echo times, respectively, $\tau_1$ and $\tau_2$ designate the first and second echo times, respectively, ln designates the natural logarithm, and the + designates a complexly conjugated, transposed vector. It is thus enabled to determine the MR parameter via analytical calculation for each image point with combination of the different image data sets and compensation of unwanted phase portions.

The determination of the T2* relaxation time for an image point can, for example, comprise the determination of a scalar product of the complexly conjugated (and possibly transposed) second image point vector and the second image point vector of the corresponding image point. Furthermore, a scalar product of the complexly conjugated (and possibly transposed) first image point vector and the first image point vector can be determined and a division of the two scalar products can take place. For example, the T2* relaxation time for an image point can be determined according to the equation $$[T_2^*]_1 = \frac{2(\tau_1 - \tau_2)}{\ln\left[\frac{\vec{d}_2^+ \vec{d}_2}{\vec{d}_1^+ \vec{d}_1}\right]}. \quad (2)$$

Here as well an improvement of the precision in the T2* determination is possible since, given the cited procedure, a suitable combination of the data from the different image data sets as well as the compensation of the magnitude portions (caused by the individual coil sensitivities, for example) can take place.

In one embodiment additional image data are provided for different echo times, which image data respectively comprise image data sets acquired with the at least two acquisition coils. The MR parameters can then be determined (respectively with spatial resolution) from multiple pairs of image data with different associated echo times. Multiple spatially resolved parameter maps of the MR parameter are thereby obtained. The method can furthermore include the combination of the parameter maps for the MR parameters that were determined from the multiple pairs of image data.

Since multiple pairs of image data are drawn upon in the determination, the precision of the parameter determination can be further increased.

Pairs of image data can be used that respectively have essentially the same difference of the associated echo times. Pairs for different echo time differences can also be used for the parameter determination since the resulting parameter map is independent of the echo time difference, such that even in such a case the different parameter maps can be combined.

The image data with different associated echo times can have been acquired with a series of echoes, and one pair of image data can then be respectively formed from image data that were both acquired at an even or that both were acquired at an odd echo in the series of echoes. For example, k-space is scanned with multiple echo trains, wherein one k-space line for different TEs is acquired with each echo train. For example, this can take place with an MGRE sequence (multiple gradient-recalled echo sequence). For example, from the image data reconstructed for different TEs the image data acquired at the 1st and 3rd and 2nd and 4th echo can then be combined into pairs. The combination of even and odd echoes enables the improved compensation of phase effects that, for example, can occur due to temporal workflow errors in the scanning of k-space and that are different for even and odd echoes.

The method can furthermore include the implementation of an error estimation for the image data sets of the provided image data and the implementation of an error estimation for the determined parameter maps on the basis of the error estimate for the image data sets from which the respective parameter map was determined. The error estimation can take place via the determination of variances or a covariance matrix. Given a combination of the different parameter maps into a combined parameter map, the implementation of an error estimation can additionally take place for this. The error of the final MR parameter determined with spatial resolution can be estimated with this.

The combination of the parameter maps of the MR parameter that were determined from the multiple pairs of image data can take place under consideration of the error estimate for the respective parameter map. For example, a weighting can take place on the basis of a covariance matrix such that areas of the parameter map that are afflicted with a greater uncertainty or variance are weighted less in the combination than areas that have a lower variance. The errors in the combined parameter map can therefore be minimized.

Furthermore, the method can comprise the implementation of an error estimation for the image data sets of the provided image data. The formation of the pairs of image data can then take place such that, for a pair of image data in the two image data sets of the same acquisition coil, the regions at which the error estimate indicates a greater error are arranged at different spatial positions of the two image data sets. This avoids regions with greater errors from overlapping in the combination of the image data. The precision of the MR parameter determination can thus be improved. The error estimation can take place via (for example) the determination of covariance matrices or g- (geometry-) factors for the image data sets.

The image data sets of the first or, respectively, second image data were advantageously respectively acquired in parallel with the different acquisition coils.

For example, the provided image data can have been acquired and reconstructed with a partially parallel acquisition (ppa) method. Such imaging methods are, for example, GRAPPA, SMASH or SENSE. An error estimation—for example via determination of a covariance matrix—for the image data is also possible given such an image reconstruction.

The image data can have been acquired with a multi-echo imaging method, in particular an MGRE imaging method, wherein the image data respectively correspond to an echo in a series of echoes that were acquired with the multi-echo imaging method.

Given use of a ppa method with an MGRE sequence, different spatial distributions of the errors in the image data sets that were acquired with the same acquisition coil for different TEs can be achieved in that different k-space lines were omitted for different echo times. Variances in the resulting combined parameter map can thus be reduced.

In particular, the k-TE GRAPPA method known from "k-TE Generalized Autocalibrating Partially Parallel Acquisition (GRAPPA) for Accelerated Multiple Gradient-Recalled Echo (MGRE)R2* Mapping in the Abdomen", Xiaoming Yin et al., Magnetic Resonance in Medicine 61:507-516 (2009) can be used to acquire and reconstruct the image data.

The method according to the invention can also itself include the acquisition of the image data, wherein the acquisition of the image data advantageously takes place such that the image data acquired with an acquisition coil for different echo times have regions of higher g-factors at different spatial positions.

In one embodiment the method furthermore includes the conversion of at least a portion of the first and/or second image data with associated first or, respectively, second echo time into a different, predetermined echo time using the at least one defined MR parameter. For example, an adaptation of the phase in the image data on the basis of the determined resonance frequency shift $\omega$ and an adaptation of the magnitudes in the image data based on the determined T2* relaxation time can take place. With knowledge of these parameters the development of the phase or magnitude with the echo time can take place in a simple manner. The resulting phase or magnitude furthermore depends on the difference of the first or second echo time and the predetermined echo time. Such converted or extrapolated images can subsequently be reasonably combined, which represents a significant improvement relative to a combination of the original image data and the assignment of an equivalent echo time.

In one embodiment the method can furthermore comprise the provision of third or additional image data for a third or, respectively, additional different echo time(s), wherein corresponding image point vectors for the respective echo time can be determined for the additional provided image data. The at least one MR parameter can then be determined on the basis of the image point vectors for at least the first, second and third echo time via an analytical calculation. More image data than the cited first and second image data can thus enter into the direct calculation of the MR parameter.

According to a further aspect of the present invention, a magnetic resonance system is provided for spatially resolved determination of at least one MR parameter that influences an MR signal detected in an MR measurement of a region of an examination subject. The magnetic resonance system has an acquisition unit that is designed to acquire MR signals with an echo imaging sequence, wherein the acquisition unit comprises at least two reception coils. Furthermore, a control unit is provided that is designed to activate the acquisition unit to acquire first complex image data with the echo imaging sequence during a first echo time, wherein the first image data include at least one first image data set that was acquired with a first of the acquisition coils and a second image data set that was acquired with a second of the acquisition coils, and to activate the acquisition unit to acquire second complex image data with the echo imaging sequence during a second echo time, wherein the second image data include at least a first image data set that was acquired with the first acquisition coil and a second image data set that was acquired with the second echo coil. The different image data sets have corresponding complex image points with regard to the imaged image data sets. The magnetic resonance system has a computer to determine the MR parameter for at least one part of these image points. The computer is designed (configured) in order to determine a first image point vector for the first echo time from the first image data and a second image point vector for the second echo time from the second image data for each of the image points, wherein each image point vector represents the corresponding image points of the at least two image data sets of the respective image data. The computer is furthermore designed to determine the at least one MR parameter for each of the image points on the basis of the image point vector for the first echo time and the image point vector for the second echo time for the respective image point. The determination includes a combination of the vectors such that echo time-independent phase or magnitude portions in the acquired image data are at least partially compensated.

Advantages similar to those cited above can be achieved with the MR system according to the invention. The magnetic resonance system is designed for implementation of any of the methods described above.

The invention furthermore encompasses a non-transitory, electronically readable data storage medium with electronically readable control information stored on it, in which the storage medium is loaded, and a computer system that is functionally connected with a magnetic resonance system, for example, to execute any or all of the embodiments of the method described above.

Naturally, the features of the embodiments and aspects of the invention that are described in the preceding can be combined with one another. In particular, the features can be used not only in the described combinations but also in other combinations or taken separately without departing from the scope of the invention.

DESCRIPTION OF THE PREFERRED EMBODIMENTS

With the present invention it is enabled to determine an MR parameter directly from a number of image data sets, with as few errors as possible. In particular, the resonance frequency shift ω—thus a change of the precession frequency of the protons, for example due to the chemical environment (chemical shift) or the local temperature—and the $T2^*$ relaxation time should be determined. In conventional methods, the phases and magnitudes (which experience significant variations due to different effects, however) in the image data are analyzed for this. Phase shifts can result from inhomogeneities of the B0 field or from the reception chain (receive chain), wherein these likewise affect the magnitudes. In particular, the different coil sensitivities can lead to significant changes of the recorded magnitudes. Elaborate methods are conventionally used for reconstruction of the phase or to remove unwanted signal portions. If multiple coils are used to acquire the MR signals, a combination of the acquired data for the most part takes place only via addition of the magnitudes, with loss of the phase information. The evaluation of the data is thus connected with a high cost and often leads to results with precision that is in need of improvement. In the present invention the MR parameter is determined directly from the image data sets acquired at different TEs with different coils, wherein unwanted phase and magnitude portions are compensated, such that the precision of the parameter determination can be significantly improved.

Although the following description refers to defined MR imaging sequences, it should be clear that sequences other than those cited can be used insofar as the acquisition of MR data for different echo times is enabled. For example, the multi-echo imaging sequences cited in the following can also be replaced by other spin or gradient echo sequences with which image data for different TEs can be acquired.

Figure 1:
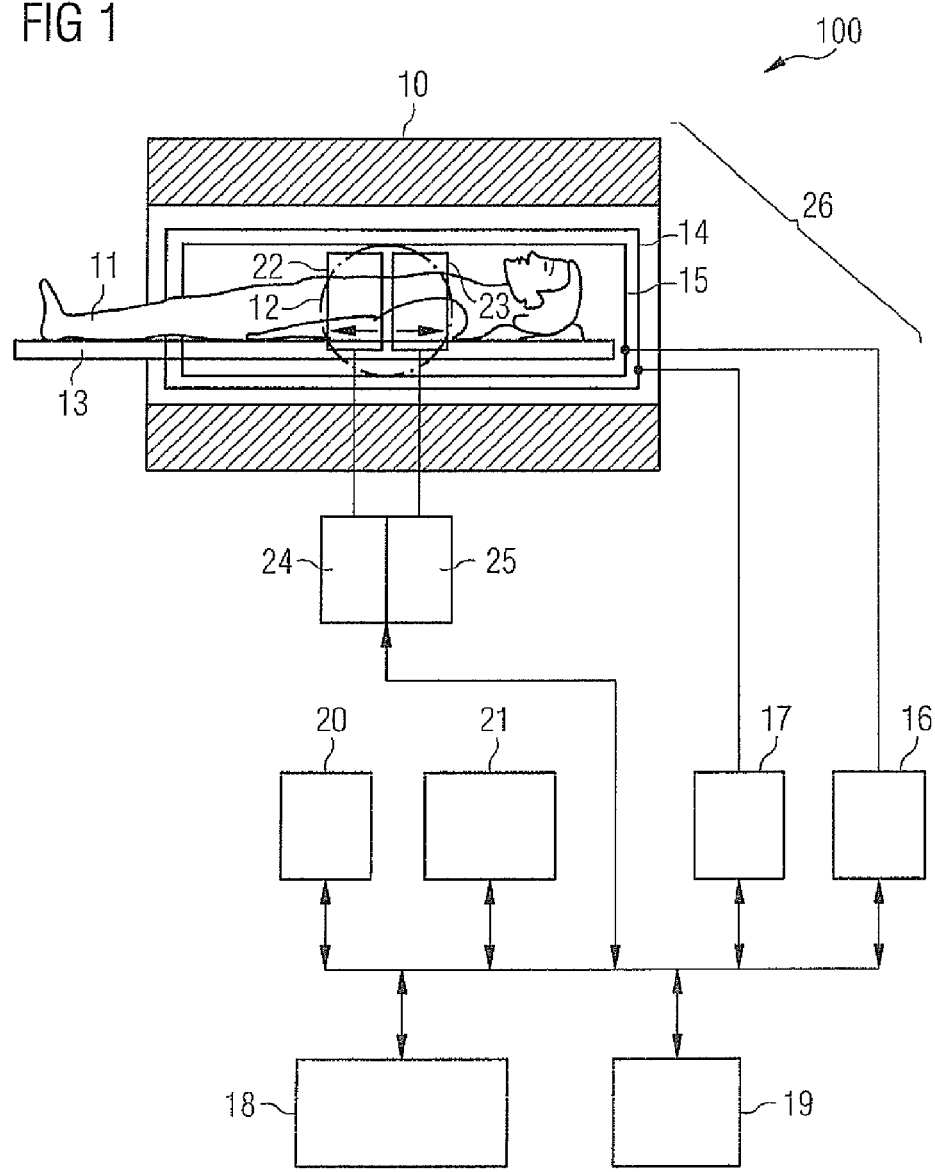
FIG. 1 is a schematic representation of a magnetic resonance system according to an embodiment of the present invention.

FIG. 1 schematically shows a magnetic resonance system according to one embodiment of the present invention. The MR system has a magnet 10 to generate a polarization field $B_0$. An examination subject—here a person 11 to be examined—can be slid on a recumbent table 13 into the magnet 10, as is schematically indicated by the arrow. The MR system furthermore has a gradient system 14 to generate magnetic field gradients that are used for the imaging and spatial coding. A radio-frequency coil arrangement 15 is provided to excite the polarization resulting in the basic magnetic field, which radio-frequency coil arrangement 15 radiates a radio-frequency field into the examined person 11 in order to deflect the magnetization out of the steady state. A gradient unit 17 is provided to control the magnetic field gradients and an RF unit 16 is provided to control the radiated RF pulses.

The acquisition of magnetic resonance signals from the examination region 12 can take place by means of the radio-frequency coil arrangement 15. In particular, given the implementation of an accelerated acquisition method (for example GRAPPA, SENSE or SMASH) the magnetic resonance system can also have local reception coils or component coils, wherein FIG. 1 shows two local reception coils 22 and 23 as an example. These can be part of a larger coil array (phase array coils, for example) that comprises multiple reception coils. Additional spatial information is obtained due to the spatially independent arrangement of the coils, and thus the different sensitivity profiles. By a suitable combination of the magnetic resonance data acquired simultaneously by the coils an additional spatial coding can essentially be achieved so that k-space does not need to be completely scanned and an acceleration of the acquisition can be achieved. The reception coils of such a coil array can respectively have their own reception units (here the reception units 24 or, respectively, 25) so that a raw data set with MR data can be acquired in parallel for each reception coil. The respective coil noise thereby remains uncorrelated so that a better SNR can be achieved.

ppa techniques such as GRAPPA, SMASH or SENSE for whose implementation the shown magnetic resonance system can be configured are known to the man skilled in the art, such that additional details of these methods are not described in detail here. The components of the magnetic resonance system—for example the units 14-17 and 22-25 that serve for the acquisition of MR data are designated as acquisition unit 26 in the following.

The magnetic resonance system is centrally controlled by the control unit 18, which controls the radiation of RF pulses and the acquisition of resulting MR signals. A reconstruction of image data from the raw MR data and a continuative processing of these take place in computer 19. An operator can select a frequency protocol via an input unit 20 and input and modify imaging parameters that are displayed at a display 21.

The general functionality of an MR system is known to those skilled in the art, so a more detailed description of the general components is not necessary herein.

Control unit 18 is configured to control the implementation of an echo imaging sequence, for example a turbo spin echo or MGRE sequence. The echo sequence can be part of an EPI sequence in which all k-space lines are scanned within one repetition period, meaning that a complete image data set is acquired after an excitation. Given an EPI (echoplanar imaging) sequence the phase coding is changed before each echo, such that the entirety of k-space can be scanned with one echo train. Segmented EPI sequences can also be used with which a portion of k-space is scanned with one echo train. An EPI sequence can be gradient echo- or spin echo-based; an equivalent echo time is normally associated with the resulting image data. The implementation of a multi echo sequence (MGRE, for example) with which a sequence of gradient echoes is generated via repeated switching of gradients is particularly advantageous. One k-space line can be scanned with an echo train, wherein each echo corresponds to a different echo time. A complete image data set can subsequently be reconstructed for each echo time TE. Each image data set thus thereby corresponds to an echo in the echo sequence.

The cited methods can be used within the scope of an accelerated imaging, in particular a partially parallel imaging method (ppa=partially parallel acquisition) such as SENSE, GRAPPA or SMASH. Control unit 18 is thereby configured to produce only an incomplete scan of k-space via the omission of k-space lines, wherein the acquisition of MR signals takes place simultaneously with the reception coils 22 and 23 (and possibly additional coils), however. A reconstruction of the missing data can then take place in k-space or in image space, depending on the method. The reconstructed data points thereby regularly have higher variances and corrections to other data points. The association is subsequently described with more precision with these.

Control unit 18 can likewise be set up in order to execute the k-TE GRAPPA method described in "k-TE Generalized Autocalibrating Partially Parallel Acquisition (GRAPPA) for Accelerated Multiple Gradient-Recalled Echo (MGRE)$R_2^*$ Mapping in the Abdomen", by Xiaoming Yin et al., Magnetic Resonance in Medicine 61:507-516 (2009). k-TE GRAPPA uses an MGRE acquisition sequence in which peripheral regions of k-space are only incompletely scanned. Omitted k-space lines are reconstructed not only using adjacent k-space lines that were acquired with adjacent coils of the coil array but also using k-space lines for adjacent echo times, which leads to a reduction of artifacts. The result is complete image data sets for the different echo times and for the different coils that are used.

The image reconstruction is implemented by computer 19 by means of conventional reconstruction methods suitable for the respective acquisition sequence. For example, this can be a simple two-dimensional Fourier transformation but can also be the application of a GRAPPA or SMASH kernel. In the image reconstruction, corresponding complex image data that contain both magnitude and phase information are obtained from the complex raw MR data acquired with acquisition unit 25. For example, a conventional evaluation of the image data represents the calculation of a magnitude image ($\sqrt{(\text{real part}^2 + \text{imaginary part}^2)}$) or a phase image (arctan (imaginary part/real part)). Due to the aforementioned unwanted phase and magnitude portions in such images, however, these do not represent a good basis for continuative analyses.

To solve this problem, computer 19 is designed in order to determine an MR parameter on the basis of the complex image data provided after the reconstruction so that these are unwanted phase or, respectively, magnitude portions are compensated. This is described in more detail in the following with reference to FIGS. 2 through 7.

Figure 2:
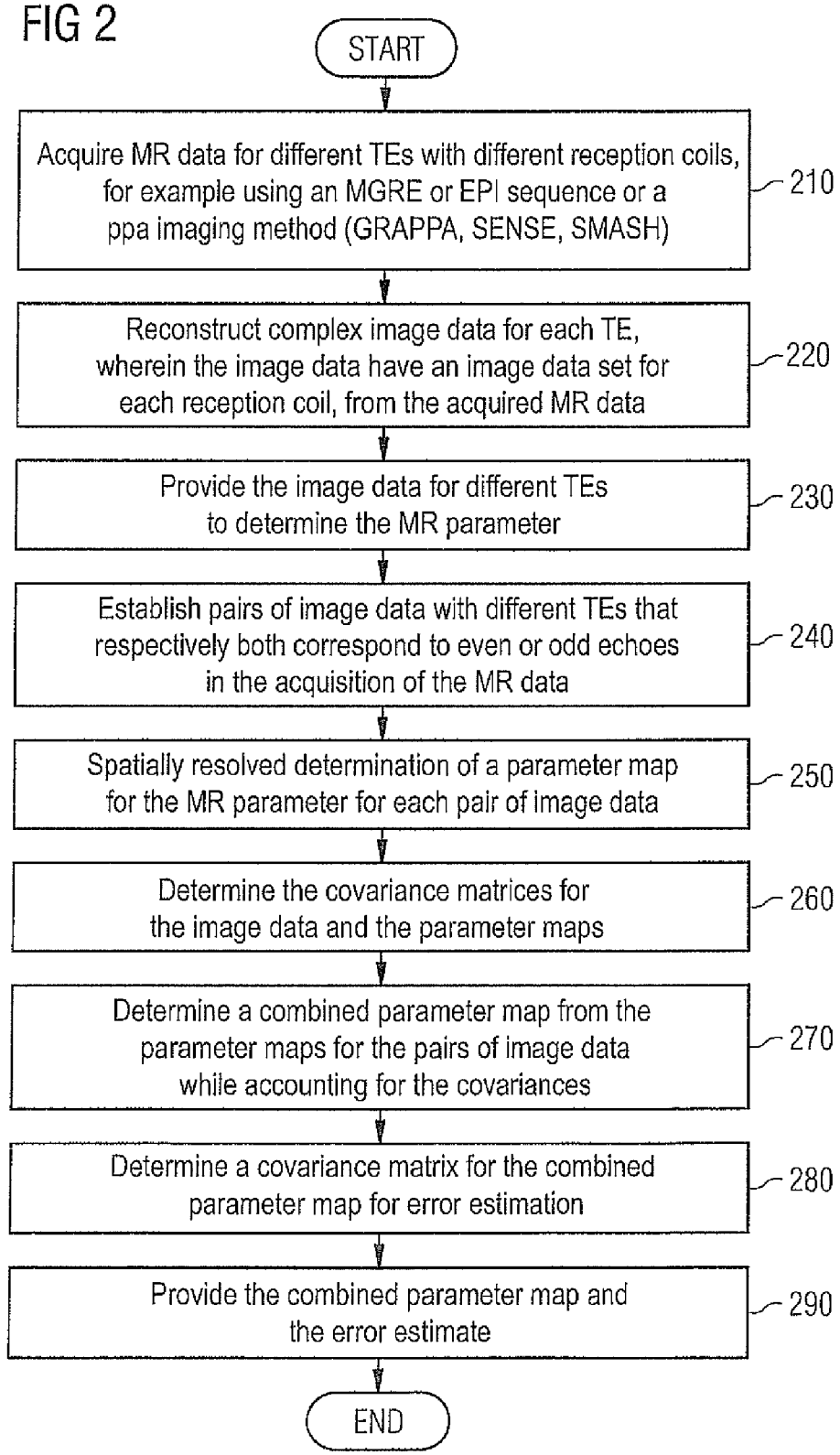
FIG. 2 is a flow chart that illustrates a method for spatially resolved determination of an MR parameter according to an embodiment of the present invention.

FIG. 2 shows a flow chart of an embodiment of the method according to the invention that can be executed at the MR system 100 shown in FIG. 1. In Step 210 MR data for different echo times TE are acquired with different acquisition coils (reception coils). Control unit 18 can therefore initiate the implementation of one of the aforementioned acquisition sequences. In particular, the MGRE sequence and the single shot EPI or segmented EPI sequences (for different equivalent TE) are considered, for example in combination with a ppa method. It is only important that image data sets for different coils and TEs can be obtained from the acquired MR data, possibly after corresponding expansion via reconstruction.

The reconstruction of complex image data for each echo time TE takes place in Step 220 via computer 19. The image data for an echo time contain an image data set for each acquisition coil. An image data set can represent either a two-dimensional image or a three-dimensional image, thus the image data sets have image points in the form of pixels or voxels. If a partially parallel acquisition method is used, the reconstruction can initially take place by expansion of the raw data in k-space and subsequent Fourier transformation, or via unfolding of the image data sets for different coils in image space. "Complex image data set" means that the image data set contains both magnitudes and phase information, thus that a complex value is assigned to each image point of the image data set, for example. Complex image data 510 for an echo time TE1 with the image data sets 511 (coil S1), 512 (coil S2) and 513 (Coil S3) are illustrated as examples in FIG. 6.

The complete, reconstructed image data sets are provided in Step 230 to determine the MR parameter. This takes place in the following Steps 240-290.

In the method of the present embodiment the MR parameter is determined repeatedly from respective pairs of image data. In Step 240 pairs of image data with different associated TEs are formed so that the first and second image data of a pair both correspond to an even echo or an odd echo in the preceding exposure. This is shown as an example in FIG. 5, for example; given use of an MGRE sequence image data 510 are acquired at TE1 with the first echo, image data 520 are acquired at TE2 with the second echo etc. As illustrated, pairs of image data are formed either from odd echoes (TE1 and TE3; TE3 and TE5; . . . ) or even echoes (TE2 and TE4; . . . ). This is advantageous since—due to errors in the time workflow of the sequence—phase effects can occur that are different for even and odd echoes. Echoes that are acquired from left to right in k-space along the phase coding direction can have a different time shift than echoes that are acquired from right to left, which leads to a phase shift in image space. Given a described pairing this unwanted phase portion can be compensated in the subsequent parameter determination.

However, such a pairing is optional. In principle, the pairs can be formed from image data with arbitrary associated TEs. Given other acquisition sequences that do not cause any such phase portions, this leads to no disadvantages. It is also conceivable to form the pairs such that the associated echo times always essentially have the same echo time difference. The determination of the MR parameter is then based on an equivalent basis.

Figure 5:
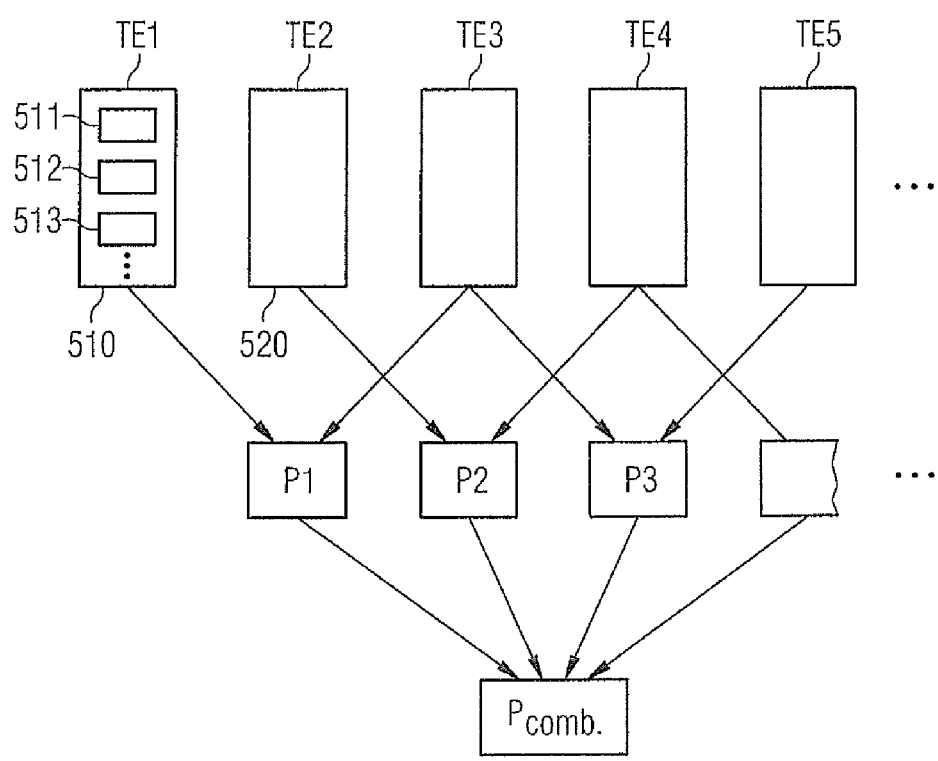
FIG. 5 schematically illustrates the determination of the MR parameter from image data for different echo times TE.

The MR parameter is determined for each image point (for each pixel or for each voxel) in Step 250, wherein a parameter map is obtained that presents the values of the MR parameter with spatial resolution. This takes place for each pair of image data, as is illustrated in FIG. 5. Multiple parameter maps P1, P2, P3 are thus obtained for the same MR parameters. The determination of the MR parameter for a pair of image data is illustrated in detail in FIG. 3. Steps 251-253 can be implemented for each pair of image data at Step 250.

Figure 6:
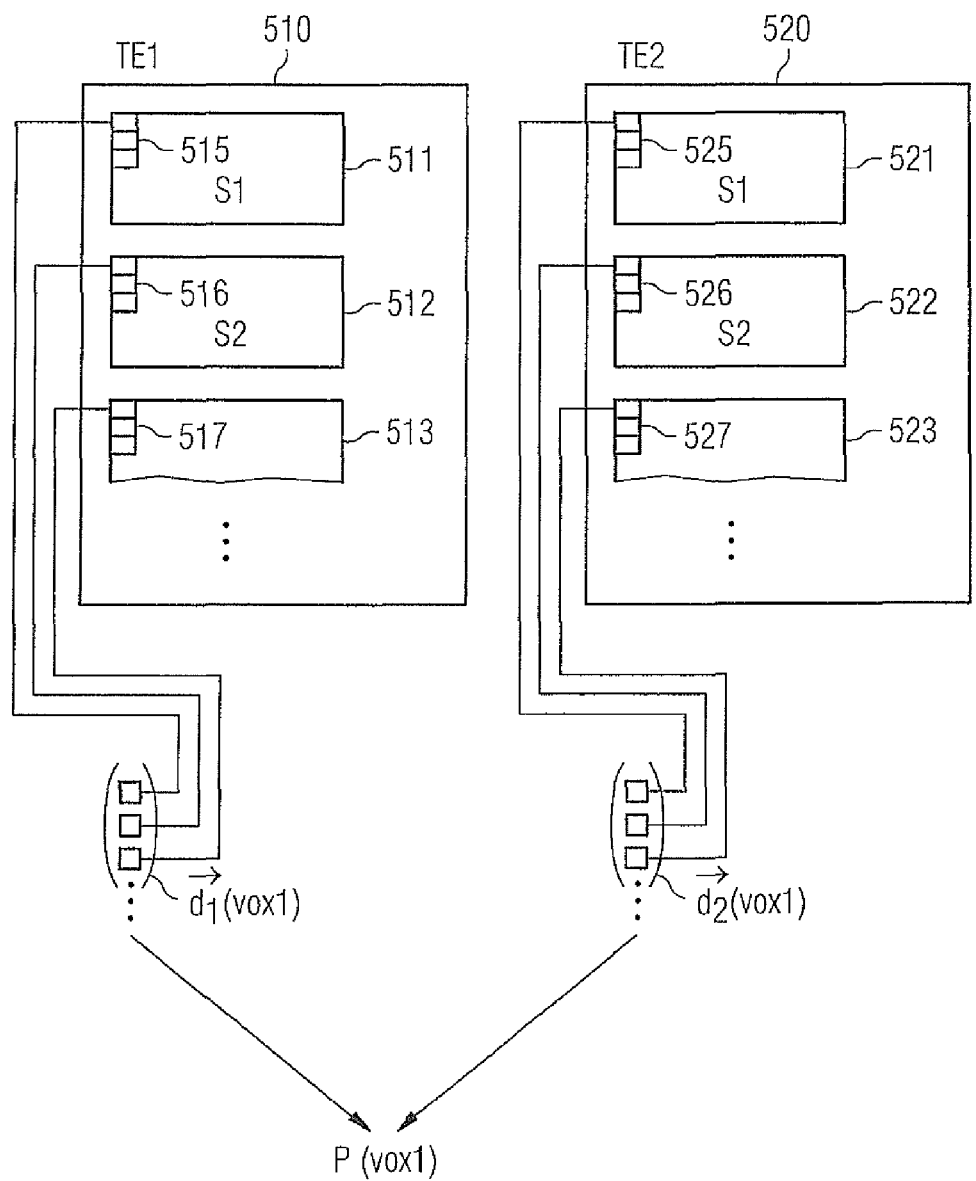
FIG. 6 schematically illustrates the formation of image point vectors for each image point and the subsequent combination of the vectors.
Figure 7:
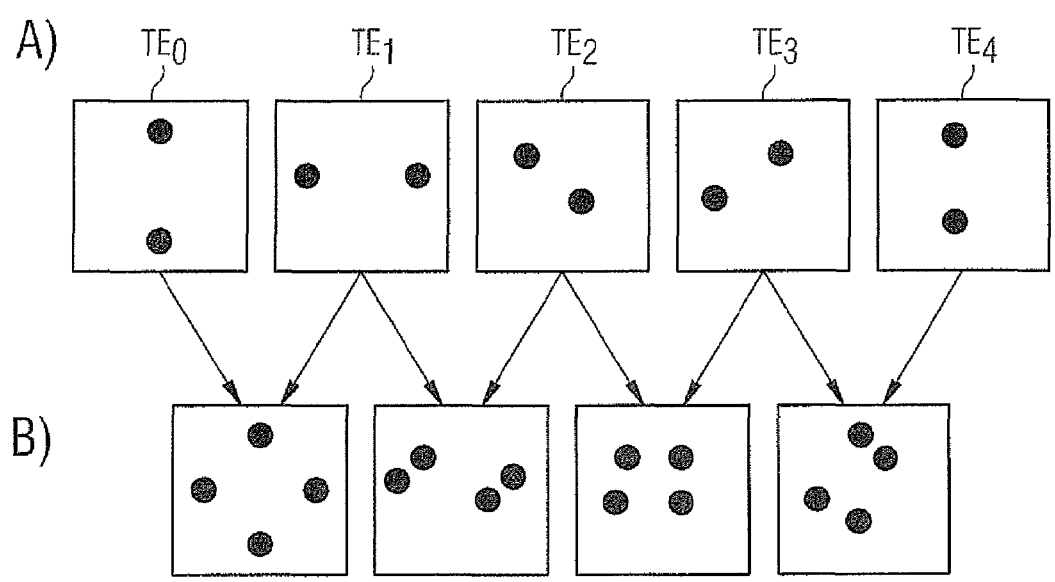
FIGS. 7A and 7B illustrate the spatial attitude of regions with high variances in image data sets for different echo times and in parameter maps determined from these data sets.

An image point vector is formed as follows for each TE and for each image point in Step 251. The image data sets for the different reception coils form the same fields of view, or at least fields of view that overlap to a large extent. The different image data sets thus contain image points that essentially image the same volume element of the examined subject (thus that correspond in this regard). This is illustrated in FIG. 6, in which a pair of image data 510 and 520 for the echo times TE1 and TE2 is show that respectively comprise image data sets (511, 512 and 513, and 521, 522 and 523, respectively) acquired with the reception coils S1, S2 and S3. The image points 515, 516 and 517 and 525, 526 and 527 depict the same volume element ("voxel1"), and thus are corresponding image points. For each TE an image point vector—which is designated with d1(voxel1) and d2(voxel2) for TE1 and TE2 respectively in FIG. 6—is then created from these corresponding image points. Two vectors d1 and d2 are thus determined for each of the image points that are imaged together in the different image data sets. The MR parameter (P(Voxel1) in FIG. 6) is determined from these for the corresponding image point. It should be clear that the elements of the vectors represent complex numbers, and that the image points in the vectors are respectively arranged in the same order.

The determination of the MR parameter for each of these image points takes place in Step 252 with simultaneous compensation of the TE-independent phase or, respectively, magnitude portions. The parameter determination is concretely described in the following for two specific examples.

In a first example the resonance frequency shift $\omega$ should be determined that, for example, can result from susceptibility differences of tissue types or contrast agents, from a flow of protons, from a chemical shift or temperature-dependent changes of the proton resonance frequency. The latter can occur given a temperature-dependent chemical shift. For each image point the following relationship can be set up for the image point vectors d1 and d2:

$$e^{-2i(\tau_2-\tau_1)\omega} = \left[\frac{\vec{d}_2^+ \vec{d}_1}{\vec{d}_1^+ \vec{d}_2}\right]. \tag{3}$$

$\tau_1$ and $\tau_2$ thereby designate the first and second echo times, ln designates the natural logarithm, and the +designates a complexly conjugated, transposed vector. For vectors of length one (i.e. scalars) this relationship can be tracked without additional measures given polar notation of the complex image point values. $\omega$ can now be analytically determined from this relationship:

$$\omega = \frac{1}{-2i(\tau_2-\tau_1)} \ln\left[\frac{\vec{d}_2^+ \vec{d}_1}{\vec{d}_1^+ \vec{d}_2}\right]. \tag{1}$$

With this formula the MR parameter $\omega$ can be determined individually for each image point from the image point vectors. Via the formation of the scalar product with the complexly conjugated vector for different TEs, the TE-independent phase portions are removed since these are similarly present in both vectors. Only the TE-dependent phase portions that are desired and necessary for the determination of $\omega$ remain. Moreover, the amplitudes (thus also the TE-independent amplitudes) are compensated via the division of the scalar products. The significant interfering influences are compensated automatically in the determination of $\omega$. Moreover, the determination of $\omega$ is based on 2*M image data sets, wherein M is the number of reception coils to acquire image data. Since these generally have uncorrelated noise, the signal-to-noise ratio (SNR) and therefore the precision of the parameter determination are improved. ppa methods with correlations and higher variances are discussed later.

The second example concerns the determination of the T2* relaxation time. The T2* relaxation time is a time constant of the exponential decay of the transversal component of the excited magnetization, wherein the decay is significantly based on spin-spin relaxation processes (purely T2 relaxation). The T2* relaxation is accelerated relative to the T2 relaxation time, for example via magnetic field inhomogeneities, susceptibility differences of different tissue types or the like. While the decay of the magnetization due to magnetic field inhomogeneities is compensated by the rephasing of the magnetization in echo sequences, the susceptibility differences also lead to an attitude of the MR signal in gradient echo sequences, wherein this accelerated signal decay is likewise designated as a T2* relaxation.

For each image point the following relationship can be set up for the image point vectors d1 and d2:

$$e^{-(\tau_2-\tau_1)/[T_2^*]_h} = \left[\frac{\vec{d}_2^+ \vec{d}_2}{\vec{d}_1^+ \vec{d}_1}\right]^{1/2}. \tag{4}$$

This relationship can also be reproduced without additional measures for vectors of length one (i.e. scalars) given polar notation of the complex image point values. A combination of image data sets acquired for different coils and TEs can take place in the determination of the MR parameter via the expansion of image point vectors. T2* can be determined analytically from this relationship:

$$[T_2^*]_1 = \frac{2(\tau_1 - \tau_2)}{\ln\left[\frac{\overline{d_2^+ d_2}}{\overline{d_1^+ d_1}}\right]}. \quad (2)$$

With this formula the MR parameter T2* can be determined individually from the image point vectors d1 and d2 for each image point. The determination of the T2 relaxation time is based on the magnitudes of the complex values in the image point vectors for the two TEs, wherein via the use of the image data for two TEs, TE-independent magnitude portions are compensated that, for example, are caused by coil sensitivities or the respective reception channel. With the method, T2* can thus be determined analytically and with improved precision based on multiple image data sets.

The determination of additional MR parameters and the use of other formalisms for these are naturally likewise possible. For example, corresponding formulas for image point vectors can be set up for three or more different echo times. The precision can be further increased via the simultaneous use of data for three or more echo times of the determination of the MR parameter. In addition to the cited analytical determination of the MR parameters, a numerical determination is likewise conceivable.

The determination of the MR parameter per image point is repeated for all image points in Step 253, wherein a parameter map of the MR parameter is obtained. Naturally, it is possible to implement the determination for only a selected portion of the image points, for example in a "region of interest", whereby the method can be accelerated.

In the method, image data can also be used that were acquired with a partially parallel (acquisition) method. Since k-space is only incompletely scanned in this method, missing k-space data must be reconstructed either in k-space itself or in image space, which for the corresponding image points leads to an increased image noise and to correlations between the image points. This can be taken into account in different ways in the determination of MR parameters from such data. In Step 260 the implementation of an error estimation for the image data sets takes place via the determination of covariance matrices for the image data. The determined covariance matrices can be used in different ways.

The pairs of image data can be established in Step 240 so that image data are combined that have covariance matrices of varying shapes. It can therefore be avoided that regions with high g-factors (geometry factors) are superimposed and thus lead to greater errors in the determination of the MR parameter in a corresponding region. This is illustrated as an example in FIG. 7A and 7B. FIG. 7A shows image data sets for different TEs that were acquired with a reception coil. Regions with increased g-factors are shown as black ovals. A different distribution of these regions can be achieved in that the positions of omitted lines in k-space are varied. The regions with increased g-factors do not overlap in the determination of parameters that are illustrated in FIG. 7B. FIG. 7B essentially represents the regions of increased variances in the MR parameter maps determined from the pairs of image data sets. In a comparison of the parameter maps, it is significant that there is for each region a parameter map in which the variances are not increased. This can be utilized as described in the following given the combination of the different determined parameter maps.

The calculation of the covariance matrices for a reconstructed image data set can take place in a conventional manner and can be implemented independent of whether GRAPPA, SENSE, SMASH or a different transformation was used to generate the complete image data. Such methods can use the conditioning of inverses, a priori information etc., for example. In such methods, a combination of echoes of adjacent TEs can also already take place, for example in the aforementioned k-TE GRAPPA. For iterative methods it is also possible to determine a linear transformation between the original data and the reconstructed image data.

In the aforementioned method to determine the covariance matrices, it is assumed that the noise in the various coils and TE image data sets is not correlated and that the signals are scaled such that all image points or, respectively, voxels have the same noise level. The noise between different coils can be decorrelated in that noise of all coils is measured and a coif noise covariance matrix is calculated that is subsequently used to decorrelate the noise. This is a conventional technique which is not discussed in detail here. Apart from the use of acquisition methods such a k-TE GRAPPA or the like, the noise in the image data sets for different TEs is uncorrelated. If a method such as k-TE GRAPPA is used to acquire and reconstruct the image data sets, the assumption of uncorrelated noise between different TE data sets can be considered as a good approximation. There are diverse established methods for the estimation and scaling of spatial noise distributions which result via reconstruction methods such as GRAPPA, SENSE, SMASH or the like (known as the "g-factor").

An error estimation or, respectively, a determination of the noise for the determined MR parameter maps can take place using error propagation methods, for example. An approximation of the noise can be determined based on a Laplace approximation. This is described in detail in "Information Theory, Interference, and Learning Algorithms", by David J. C. MacKay, Cambridge University Press, Version 6.0/2003, Chapter 27, P. 341 and the following. Based on this method, covariance matrices can be obtained for the determined MR parameter maps. The covariance matrices for the parameter maps are likewise determined in Step 260.

The determination of a combined parameter map from the individual parameter maps can subsequently take place for the pair of image data under consideration of the error estimate, in particular the determined covariance matrices. The simplest type of combination of the parameter maps that can likewise be used is an averaging of the different parameter maps. However, it is advantageous to take the covariance matrices into account in the combination to minimize the variances of the MR parameters determined for each image point. In particular, regions of the parameter maps in which the MR parameters have increased variances can thus be weighted less in the combination than corresponding regions in other parameter maps with lower variances. For example, in the combination of the parameter maps the regions shown dark in FIG. 7B are weighted lower so that the error in the combined parameter maps is minimized, which leads to a further improvement of the precision of the parameter determination.

Furthermore, in Step 280 an error estimation can take place for the combined parameter map, for example by determining a covariance matrix for this. Conclusions about the confidence of the parameter determination can be made with such an error estimate.

The combined parameter map and the error estimate can subsequently be provided for an additional use (Step 290). For example, the determined parameter map can be used for a susceptibility-weighted imaging or for a PRF shift thermometry.

Figure 3:
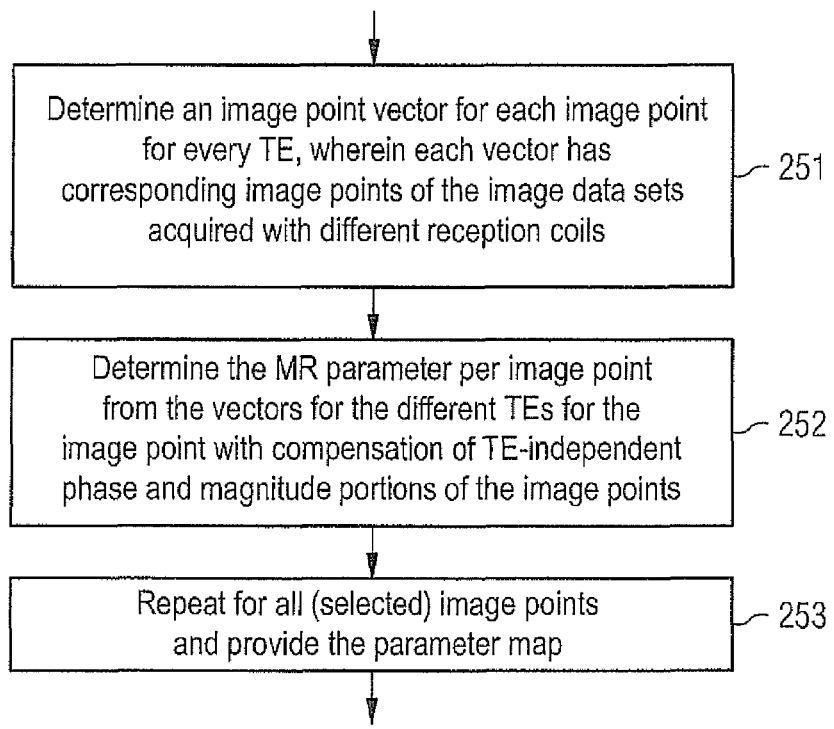
FIG. 3 is a flow chart that illustrates an embodiment of Step 250 of the method of FIG. 2.
Figure 4:
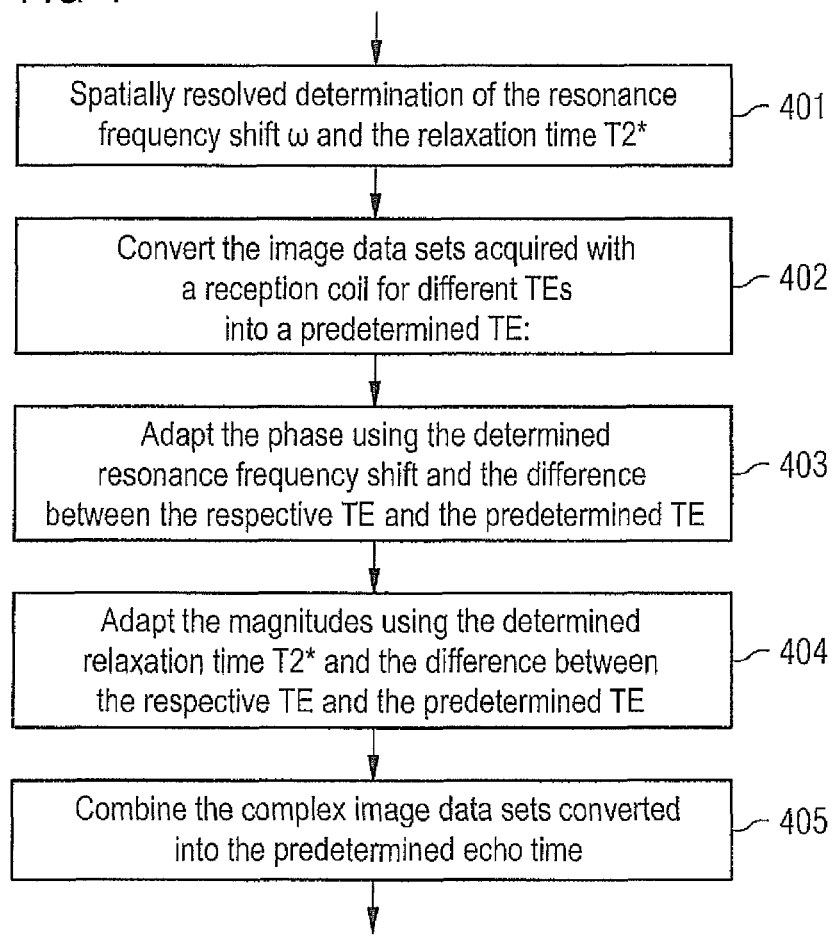
FIG. 4 is a flow chart with additional method steps that can be implemented in the method of FIG. 2.

The methods described in the preceding with reference to FIGS. 2 and 3 can furthermore include the Steps shown in the flow diagram of FIG. 4. As described in the preceding, in Step 40 parameter maps are determined for the resonance frequency shift ω and the relaxation time T2*. With knowledge of this parameter it is now known how the phases and the magnitudes in the image data develop as time passes (proportional to Exp(iωτ) or Exp(−1/T2*·τ)). With this knowledge, in Step 402 the conversion takes place of the image data sets acquired for different echo times TE with a reception coil at a predetermined echo time. The image data sets are thus essentially extrapolated at a common echo time.

This takes place in Step 403 by adaptation of the phase using the determined resonance frequency shift ω and the difference of the echo time TE of the respective image data set from the predetermined echo time. Moreover, in Step 404 the adaptation of the magnitudes takes place using the determined relaxation time T2* and again the difference of the respective image data set from the predetermined echo time. Each image data set is thus phase-shifted and scaled. The result is multiple equivalent image data sets for the same TE.

These image data sets can be complexly combined in a simple manner in Step 405 (for example via averaging), whereby a higher signal-to-noise ratio is achieved. A combination of the image data that is significantly improved relative to conventional methods is thus provided, since conventional methods merely combine the magnitudes of the image data and assign an equivalent echo time to the resulting image data set. In the methods described herein the phase information for the predetermined echo time is also maintained via the combination of the complex image data sets.

Given the use of a ppa method, the method described in the preceding can be resorted to for the combination of the image data while taking covariance matrices into consideration in order to also achieve an improvement of the noise in the resulting combined image data here.

In summary, the present invention provides a method and a corresponding magnetic resonance system with which TE-independent effects can be removed in the determination of MR parameters using different echo times. Furthermore, the image data sets of different coils and for different echo times can be directly combined with one another in the parameter determination. This represents a suitable and consistent combination of image data sets that were acquired for different echo times, and therefore a significant improvement relative to the conventional practice of assigning an equivalent echo time. The methods described herein can also be used in combination with an undersampling of k-space (ppa method). An error estimation for the determined MR parameter can also be implemented both for conventional acquisition methods and for ppa methods. Furthermore, image data sets can be extrapolated based on the determined parameters at a predetermined echo time, such that an improved combination of the complex image data sets is enabled.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for spatially resolved determination of at least one magnetic resonance parameter that influences a magnetic resonance signal detected in acquisition of magnetic resonance data from a region of an examination subject, comprising:

providing a first complex image data set to a processor that were acquired from an imaged volume of an examination subject with an echo imaging sequence during a first echo time, said first complex image data comprising at least one first image data set acquired with a first acquisition coil of a data acquisition unit in which said echo imaging sequence was implemented, and a second image data set acquired with a second acquisition coil of said data acquisition unit;

providing a second complex image data set to said processor that were acquired from said imaged volume of said examination subject with said echo imaging sequence during a second echo time, said second complex image data comprising at least one third image data set acquired with said first acquisition coil and a fourth image data set acquired with said second acquisition coil;

said first, second, third and fourth image data sets each comprising complex image points that respectively correspond with each other from data set-to-data set with respect to said imaged volume of the examination subject;

in said processor, determining a magnetic resonance parameter for at least a portion of said image points of said first, second, third and fourth image data sets by determining, for each of said image points, a first image point vector for said first echo time from said first complex image data that comprises corresponding image points of said first image data set and said second image data set, and determining a second image point vector for said second echo time from said second complex image data, that comprises corresponding image points of said third image data set and said fourth image data set, and combining said first and second image point vectors to produce a vector combination for which echo time-independent phase portions or echo time-independent magnitude portions in the first and second complex image data set are compensated, and determining for each image point, at least one magnetic resonance parameter from said vector combination; and making the respective magnetic resonance parameters for the respective image points available at an output of said processor in a form for use in reconstructing an image from said image points.

2. A method as claimed in claim 1 comprising determining resonance frequency shift as said at least one magnetic resonance parameter.

3. A method as claimed in claim 2 comprising determining said resonance frequency shift for each image point by calculating a complexly conjugated second image point vector and forming a scalar product of the complexly conjugated second image point vector and said first image point vector.

4. A method as claimed in claim 3 wherein said scalar product is a first scalar product, and comprising determining said resonance frequency shift for each image point by calculating a complexly conjugated first image point vector and forming a second scalar product of said complexly conjugated first image point vector and said second image point vector, and dividing said first and second scalar products.

5. A method as claimed in claim 2 comprising determining said resonance frequency shift ω for each image point according to:

$$\omega = \frac{1}{-2i(\tau_2 - \tau_1)} \ln\left[\frac{\vec{d}_2^+ \vec{d}_1}{\vec{d}_1^+ \vec{d}_2}\right],$$

wherein $d_1$ is said first image point vector, $d_2$ is said second image point vector, $\tau_1$ is said first echo time, $\tau_2$ is said second echo time, ln is the natural logarithm, and † designates a complexly conjugated, transposed vector.

6. A method as claimed in claim 1 comprising determining a T2* relaxation time for each image point as said at least one magnetic resonance parameter.

7. A method as claimed in claim 6 comprising determining said T2* relaxation time for each image point by calculating a complexly conjugated second image point vector and forming a scalar product of the complexly conjugated second image point vector and the second image point vector.

8. A method as claimed in claim 7 wherein said scalar product is a first scalar product, and comprising determining said T2* relaxation time for each image point by calculating a complexly conjugated first image point vector and forming a scalar product of the complexly conjugated first image point vector and the first image point vector, and dividing said first and second scalar products.

9. A method as claimed in claim 6 comprising determining the T2* relaxation time for each image point according to:

$$[T_2^*]_1 = \frac{2(\tau_1 - \tau_2)}{\ln\left[\frac{d_2^\dagger d_2}{d_1^\dagger d_1}\right]},$$

wherein $d_1$ is said first image point vector, $d_2$ is said second image point vector, $\tau_1$ is said first echo time, $\tau_2$ is said second echo time, ln is the natural logarithm, and † designates a complexly conjugated, transposed vector.

10. A method as claimed in claim 1 comprising determining said at least one magnetic resonance parameter by implementing an analytical calculation algorithm in said processor.

11. A method as claimed in claim 1 comprising, for additional echo times additional to the first and second echo time, acquiring additional complex image data sets with said first and second acquisition coils, and determining said at least one magnetic resonance parameter additionally using pairs of acquired complex image data sets, each pair consisting of two complex image data sets having been acquired at different echo times, and, in said processor, generating multiple, spatially resolved parameter maps of said at least one magnetic resonance parameter for each pair, and combining said multiple parameter maps to produce a parameter map combination, and at making said parameter map combination available at said output of said processor.

12. A method as claimed in claim 11 comprising acquiring said additional complex image data sets from a series of echos, and forming a pair of image data from data acquired during even echos in said series of echos and forming a pair of image data from image data acquired during odd echos in said series of echos.

13. A method as claimed in claim 11 comprising, in said processor, implementing an error estimation for said first, second, third and fourth and image data sets, and implementing an error estimation from said multiple parameter maps using the error estimation for the first, second, third and fourth image data sets.

14. A method as claimed in claim 13 comprising generating said combination of error maps dependent on said error estimation for respective parameter maps.

15. A method as claimed in claim 11 comprising, in said processor, implementing an error estimation for said first, second, third and fourth image data sets and, from pairs of image data sets acquired with a same one of said first and second acquisition coils, identifying a region at which said error estimate is largest, and arranging said region at different spatial positions of the respective image data sets.

16. A method as claimed in claim 1 comprising reconstructing said image using a partially parallel acquisition technique.

17. A method as claimed in claim 1 comprising acquiring said first and second complex image data sets with a multi-echo imaging sequence, wherein said first and second complex image data sets are acquired during respective echos in a series of echos in said multi-echo imaging sequence.

18. A method as claimed in claim 17 comprising employing an MGRE imaging sequence as said multi-echo imaging sequence.

19. A method as claimed in claim 1 comprising acquiring said complex image data sets with said first and second acquisition coils such that image data sets acquired with one acquisition coil at different echo times have regions of higher G-factors at respectively different spatial positions.

20. A method as claimed in claim 1 comprising converting at least a portion of the data respectively acquired during said first and second echo times into different, predetermined echo times using said at least one magnetic resonance parameter.

21. A method as claimed in claim 20 wherein that said at least one magnetic resonance parameter is a T2* relaxation time and a resonance frequency shift, and implementing said conversion by adapting a phase of the complex image data sets based on the determined resonance frequency shift, as well as by adapting respective magnitudes in the complex image data sets based on the determined T2* relaxation time.

22. A method as claimed in claim 1 comprising acquiring additional complex image data sets during a third echo time and/or further echo times, and determining the respective image point vectors of said additional complex image data sets, whereby said at least one magnetic resonance parameter is determined on the basis of at least the point vectors associated to the first, the second and the third echo time by using an analytical calculation algorithm implemented in said processor.

23. A method as claimed in claim 1 comprising acquiring said first and second complex image data in parallel with said first and second acquisition coils.

24. A magnetic resonance system comprising:
a magnetic resonance data acquisition unit;
a computerized control unit that operates said magnetic resonance data acquisition unit, said computerized control unit being configured to operate said magnetic resonance data acquisition unit to generate a first complex image data set acquired from an imaged volume of an examination subject with an echo imaging sequence during a first echo time, said first complex image data set comprising at least one first image data set acquired with a first acquisition coil of said data acquisition unit and a second image data set acquired with a second acquisition coil of said data acquisition unit; providing a second complex image data set to said processor that were acquired from said imaged volume of said examination subject with said echo imaging sequence during a second echo time, said second complex image data set comprising at least one third image data set acquired with said first acquisition coil and a fourth image data set acquired with said second acquisition coil; said first, second, third and fourth image data sets each comprising complex image points that respectively correspond with each other from data set-to-data set with respect to said image volume of the examination subject;
a processor supplied with said first and second complex image data sets, said processor being configured to, determine a magnetic resonance parameter for at least a portion of said image points of said first, second, third and fourth image data sets by determining, for each of said image points, a first image point vector for said first echo time from said first complex image data set that comprises corresponding image points of said first image data set and said second image data set, and determining a second image point vector for said second echo time from said second complex image data, that comprises corresponding image points of said third image data set and said fourth image data set, and combining said first and second image point vectors to produce a vector combination for which echo time-independent phase portions or echo time-independent magnitude portions in the first and second complex image data set are at least partially compensated, and to determine for each image point, at least one magnetic resonance parameter from said vector combination; and said processor being configured to make the respective magnetic resonance parameters for the respective image points available at an output of said processor in a form for use in reconstructing an image from said image points.

25. A non-transitory, computer-readable storage medium encoded with programming instructions, said storage medium being loaded into a computerized control and evaluation system of a magnetic resonance imaging system that also includes a magnetic resonance data acquisition unit, said programming instructions causing said computerized control and evaluation system to:

operate said data acquisition unit to generate a first complex image data set acquired from an imaged volume of an examination subject with an echo imaging sequence during a first echo time, said first complex image data set comprising at least one first image data set acquired with a first acquisition coil of the data acquisition unit, and to generate a second image data set acquired with a second acquisition coil of said data acquisition unit;

operate said data acquisition unit to generate a second complex image data set acquired from said imaged volume of said examination subject with said echo imaging sequence during a second echo time, said second complex image data set comprising at least one third image data set acquired with said first acquisition coil and a fourth image data set acquired with said second acquisition coil;

said first, second, third and fourth image data sets each comprising complex image points that respectively correspond with each other from data set-to-data set with respect to said image volume of the examination subject;

determine a magnetic resonance parameter for at least a portion of said image points of said first, second, third and fourth image data sets by determining, for each of said image points, a first image point vector for said first echo time from said first complex image data set that comprises corresponding image points of said first image data set and said second image data set, and determining a second image point vector for said second echo time from said second complex image data set, that comprises corresponding image points of said third image data set and said fourth image data set, and combining said first and second image point vectors to produce a vector combination for which echo time-independent phase portions or echo time-independent magnitude portions in the first and second complex image data sets are at least partially compensated, and determine for each image point, at least one magnetic resonance parameter from said vector combination; and make the respective magnetic resonance parameters for the respective image points available at an output of said control and evaluation system in a form for use in reconstructing an image from said image points.

\* \* \* \* \*